US008723410B2

(12) United States Patent
Saito et al.

(10) Patent No.: US 8,723,410 B2
(45) Date of Patent: May 13, 2014

(54) LUMINESCENT COMPOSITION, ELECTROLUMINESCENT SHEET USING THE LUMINESCENT COMPOSITION, AND PROCESS FOR PRODUCING THE ELECTROLUMINESCENT SHEET

(75) Inventors: Kazue Saito, Ibaraki (JP); Yuko Iwamoto, Saitama (JP); Satoshi Naganawa, Saitama (JP); Shinichi Hoshi, Saitama (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 12/993,612

(22) PCT Filed: May 18, 2009

(86) PCT No.: PCT/JP2009/059127
§ 371 (c)(1),
(2), (4) Date: Nov. 22, 2010

(87) PCT Pub. No.: WO2009/142171
PCT Pub. Date: Nov. 26, 2009

(65) Prior Publication Data
US 2011/0084602 A1    Apr. 14, 2011

(30) Foreign Application Priority Data

May 22, 2008    (JP) ................................ 2008-134677
Feb. 27, 2009   (JP) ................................ 2009-046594

(51) Int. Cl.
*H05B 33/14*  (2006.01)

(52) U.S. Cl.
USPC ............................. 313/503; 313/498; 445/24

(58) Field of Classification Search
USPC .............. 257/40, 72, 98–100, 642–643, 759;
313/498–512, 483; 315/169.1, 169.3;
427/58, 64, 66, 532–535, 539;
428/690–691, 917; 438/26–29, 34, 82,
438/455; 445/24–25
See application file for complete search history.

(56) References Cited

U.S. PATENT DOCUMENTS

| 2,981,858 | A | * | 4/1961 | O'Connell | 313/502 |
| 3,372,852 | A | * | 3/1968 | Cornell | 228/42 |
| 5,076,963 | A | | 12/1991 | Kameyama et al. | |
| 5,552,668 | A | | 9/1996 | Hirose et al. | |
| 5,830,028 | A | | 11/1998 | Zovko et al. | |
| 6,617,784 | B1 | * | 9/2003 | Abe et al. | 313/506 |
| 7,758,935 | B2 | * | 7/2010 | Kishimoto | 428/32.77 |
| 2002/0140346 | A1 | | 10/2002 | Tsukiyama | |
| 2002/0195931 | A1 | | 12/2002 | George et al. | |
| 2003/0085384 | A1 | * | 5/2003 | Burnell-Jones | 252/301.36 |
| 2003/0222573 | A1 | * | 12/2003 | McDonough et al. | 313/503 |
| 2005/0035365 | A1 | * | 2/2005 | Sato et al. | 257/100 |
| 2006/0022591 | A1 | * | 2/2006 | Wie meier et al. | 313/506 |
| 2006/0192486 | A1 | * | 8/2006 | Ogawa | 313/509 |
| 2006/0210827 | A1 | * | 9/2006 | Becker et al. | 428/690 |
| 2007/0036930 | A1 | * | 2/2007 | Kontani et al. | 428/40.1 |
| 2007/0164658 | A1 | * | 7/2007 | Kalyanasundaram et al. | 313/498 |
| 2007/0169885 | A1 | * | 7/2007 | Mikuni et al. | 156/325 |
| 2007/0210704 | A1 | * | 9/2007 | Park et al. | 313/506 |
| 2007/0281375 | A1 | | 12/2007 | Ibe et al. | |
| 2007/0284627 | A1 | * | 12/2007 | Kimura | 257/257 |
| 2008/0029373 | A1 | | 2/2008 | Hotta et al. | |
| 2008/0123698 | A1 | * | 5/2008 | Takata et al. | 372/22 |
| 2009/0284158 | A1 | * | 11/2009 | Parthasarathy et al. | 315/169.3 |

FOREIGN PATENT DOCUMENTS

| JP | 2 75194 | | 3/1990 |
| JP | 4-190586 | | 7/1992 |
| JP | 11-329722 | | 11/1999 |
| JP | 2002-190388 | | 7/2002 |
| JP | 2002 329581 | | 11/2002 |
| JP | 2003-15557 | | 1/2003 |
| JP | 2005 268198 | | 9/2005 |
| JP | 2005-290068 | | 10/2005 |
| JP | 2006219526 A | * | 8/2006 |
| JP | 2006-236925 | | 9/2006 |
| JP | 2007-134121 | | 5/2007 |
| JP | 2007-299606 | | 11/2007 |
| JP | 2008 10418 | | 1/2008 |
| JP | 2008 65984 | | 3/2008 |

OTHER PUBLICATIONS

International Search Report issued Jun. 30, 2009 in PCT/JP09/59127 filed May 18, 2009.
Extended European Search Report issued Feb. 17, 2012 in patent application No. 09750533.3.
Marie-Pierre Gelin, et al., "Radical solution copolymerisation of vinylidene fluoride with hexafluoropropene", Journal of Fluorine Chemistry, vol. 126, No. 4, XP027851711, Apr. 1, 2005, pp. 577-585.
Japanese Office Action issued May 21, 2013, in Japan Patent Application No. 2009-046592.
Japanese Office Action issued Apr. 30, 2013, in Japan Patent Application No. 2009-046584.
Office Action issued Dec. 11, 2013, in Taiwanese Patent Application No. 98116855 filed May 21, 2009.

* cited by examiner

*Primary Examiner* — Donald Raleigh
(74) *Attorney, Agent, or Firm* — Oblon, Spivak, McClelland, Maier & Neustadt, L.L.P.

(57) ABSTRACT

The present invention provides a luminescent composition capable of providing an electroluminescent sheet with a high productivity at low costs in an efficient manner, an electroluminescent sheet obtained from the luminescent composition which can be mass-produced, and a process for producing the electroluminescent sheet. The present invention relates to a luminescent composition having a pressure sensitive adhesive property and produced by kneading and dispersing an electroluminescent substance in a resin having a glass transition temperature of from −70 to 5° C.

24 Claims, 1 Drawing Sheet

FIG. 1

| 2: Second Substrate |
|---|
| E²: Second Electrode |
| L: Electroluminescent Layer |
| E¹: First Electrode |
| 1: First Substrate |

FIG. 2

| 2: Second Substrate |
|---|
| E²: Second Electrode |
| L: Electroluminescent Layer |
| D: Dielectric Layer |
| E¹: First Electrode |
| 1: First Substrate |

FIG. 3

| 2: Second Substrate |
|---|
| E²: Second Electrode |
| D: Dielectric Layer |
| L: Electroluminescent Layer |
| E¹: First Electrode |
| 1: First Substrate |

FIG. 4

| 2: Second Substrate |
|---|
| E²: Second Electrode |
| D': Dielectric Layer |
| L: Electroluminescent Layer |
| D: Dielectric Layer |
| E¹: First Electrode |
| 1: First Substrate |

LUMINESCENT COMPOSITION, ELECTROLUMINESCENT SHEET USING THE LUMINESCENT COMPOSITION, AND PROCESS FOR PRODUCING THE ELECTROLUMINESCENT SHEET

TECHNICAL FIELD

The present invention relates to luminescent compositions, electroluminescent sheets using the luminescent compositions, and a process for producing the electroluminescent sheets, and more particularly, to luminescent compositions having a pressure sensitive adhesive property and being capable of providing electroluminescent sheets for use in advertizing media and decorating media disposed on windows of commercial buildings and automobiles, or in security sheets, etc., with a high productivity at low costs in an efficient manner, electroluminescent sheets using the luminescent compositions which can be mass-produced, and a process for producing the electroluminescent sheets.

BACKGROUND ART

As functional devices used in electric and electronic applications and optical applications, there are known electroluminescent devices capable of emitting light by applying an electric voltage thereto. The electroluminescent devices are generally classified into inorganic electroluminescent devices having a light-emitting layer formed of an inorganic electroluminescent material, and organic electroluminescent devices having a light-emitting layer formed of an organic electroluminescent material.

In particular, the organic electroluminescent devices using a thin film material which is excited and emits light by flowing an electric current therethrough have a large latent possibility of use in extensive applications including displays for cellular phones, personal digital assistants (PDA), displays for computers, information displays for automobiles, TV monitors and general illumination apparatuses, because they are capable of emitting light with a high luminance even by applying a low voltage thereto.

On the other hand, the inorganic electroluminescent devices are less capable of emitting light with a high luminance as compared to the organic electroluminescent devices, but have advantages such as excellent long-term stability and stable light emission even under severe conditions such as high-temperature conditions. For these reasons, the inorganic electroluminescent devices having a light-emitting layer formed of an inorganic electroluminescent material have been studied and researched for utilization in the application fields for which a good weather resistance, a good heat resistance, a good long-term stability, etc., are needed.

As one of the electroluminescent devices, there are known electroluminescent sheets. The electroluminescent sheets have such a basic structure in which a first substrate, a first electrode, an electroluminescent layer, a second electrode and a second substrate are successively laminated in this order. The first substrate and the first electrode are transparent. In addition, the electroluminescent layer is generally preferably formed of an inorganic electroluminescent material.

The electroluminescent sheets are used, for example, as a back light for advertizing media and decorating media which are disposed on windows of commercial buildings or automobiles, or security sheets, etc.

For example, Patent Document 1 discloses and proposes an advertizing method using a sign board in which images indicating an object to be advertized are provided on a surface of a film-shaped illuminant, and an advertizing sign board in which images indicating an object to be advertized are provided on a surface of a film-shaped illuminant. In Patent Document 1, it is described that the film-shaped illuminant is constructed from an electroluminescent device having a pair of electrode layers and an electroluminescent layer interposed between the electrode layers which is capable of emitting light by applying an electric field thereto. The electroluminescent layer is made of an inorganic electroluminescent material such as zinc sulfide and zinc oxide.

The electroluminescent layer made of the inorganic electroluminescent material is generally formed by a sintering method, a laser abrasion method, a molecular beam epitaxy (MBE) method, a physical vapor deposition (PVD) such as a sputtering method and a vacuum deposition method, or a chemical vapor deposition (CVD) method (for example, refer to Patent Document 2). However, since these methods need complicated procedures or use of expensive apparatuses, there tends to occur such a problem that the electroluminescent devices obtained by the methods inevitably become very expensive.

To solve the above problem, there is disclosed, for example, an electroluminescent lamp having such a layer structure in which an electroluminescent layer, a dielectric layer and a back electrode are successively laminated on a transparent electrode formed on a transparent film by a screen printing method, etc., using coating materials prepared by respectively dispersing an inorganic electroluminescent material obtained by activating zinc sulfide with copper and a high-dielectric material such as barium titanate in an organic binder (for example, refer to Patent Document 3).

The above technique described in Patent Document 3 may be performed without need of expensive apparatuses and complicated operations as compared to the technique described in Patent Document 2, but requires a number of steps and is unsuitable for mass production of the aimed products.

Patent Document 1: JP-A 2003-15557
Patent Document 2: JP-A 2005-290068
Patent Document 3: JP-A 4-190586

BRIEF DESCRIPTION OF THE DRAWINGS

FIG. 1 is a schematic sectional view showing a construction (a) of an electroluminescent sheet according to the present invention.

FIG. 2 is a schematic sectional view showing a construction (b) of an electroluminescent sheet according to the present invention.

FIG. 3 is a schematic sectional view showing a construction (c) of an electroluminescent sheet according to the present invention.

FIG. 4 is a schematic sectional view showing a construction (d) of an electroluminescent sheet according to the present invention.

DISCLOSURE OF THE INVENTION

Problems to be Solved by the Invention

The present invention has been made in view of the above problems. An object of the present invention is to provide luminescent compositions capable of providing electroluminescent sheets for use in advertizing media or decorating media or in security sheets, etc., with a high productivity at low costs in an efficient manner, electroluminescent sheets obtained from the luminescent compositions which can be mass-produced, and a process for producing the electroluminescent sheets.

Means for Solving the Problems

As the result of various extensive and intensive researches for achieving the above object, the present inventors have found that a luminescent composition having a pressure sensitive adhesive property and prepared by kneading and dispersing an electroluminescent substance in a resin having a specific glass transition temperature is capable of providing an electroluminescent sheet with a high productivity at low costs in an efficient manner, and that when using the luminescent composition having a pressure sensitive adhesive property to form an electroluminescent layer, it is possible to mass-produce the electroluminescent sheet.

In addition, it has been found that when a first laminate and a second laminate which respectively have a specific construction are separately prepared and bonded together only by pressing, it is possible to produce the aimed electroluminescent sheet in an efficient manner. The present invention has been accomplished on the basis of the above findings.

Thus, the present invention relates to the following aspects:

[1] A luminescent composition having a pressure sensitive adhesive property and produced by kneading and dispersing an electroluminescent substance in a resin having a glass transition temperature of from −70 to 5° C.

[2] The luminescent composition as described in the above aspect [1], wherein a content of the electroluminescent substance in the luminescent composition is from 20 to 400 parts by mass on the basis of 100 parts by mass of the resin.

[3] The luminescent composition as described in the above aspect [1] or [2], wherein the composition further includes a precipitation inhibitor in an amount of from 0.1 to 5 parts by mass on the basis of 100 parts by mass of the resin.

[4] An electroluminescent sheet including at least a first substrate, a first electrode, an electroluminescent layer, a second electrode and a second substrate which are successively laminated in this order, wherein the first substrate and the first electrode are transparent, and the electroluminescent layer is formed from the luminescent composition as described in any one of the above aspects [1] to [3].

[5] The electroluminescent sheet as described in the above aspect [4], further including a dielectric layer which is formed between the first electrode and the electroluminescent layer and/or between the electroluminescent layer and the second electrode.

[6] A process for producing the electroluminescent sheet as described in the above aspect [4], including the steps of preparing a first laminate and a second laminate by the following step (1) or (2); and bonding a side of the electroluminescent layer of the first laminate to a side of the second electrode of the second laminate, or bonding a side of the first electrode of the first laminate to a side of the electroluminescent layer of the second laminate.

Step (1): successively forming at least the first electrode and the electroluminescent layer on the first substrate to prepare the first laminate, and separately forming at least the second electrode on the second substrate to prepare the second laminate; or Step (2): forming at least the first electrode on the first substrate to prepare the first laminate, and separately successively forming at least the second electrode and the electroluminescent layer on the second substrate to prepare the second laminate.

[7] The process for producing the electroluminescent sheet as described in the above aspect [6], including the steps of preparing the first laminate and the second laminate by any one of the following steps (3) to (12); and bonding a side of the dielectric layer, the electroluminescent layer or the first electrode of the first laminate to a side of the second electrode, the electroluminescent layer or the dielectric layer of the second laminate:

Step (3): successively forming at least the first electrode, the dielectric layer and the electroluminescent layer on the first substrate to prepare the first laminate, and separately forming at least the second electrode on the second substrate to prepare the second laminate;

Step (4): successively forming at least the first electrode and the dielectric layer on the first substrate to prepare the first laminate, and separately successively forming at least the second electrode and the electroluminescent layer on the second substrate to prepare the second laminate;

Step (5): forming at least the first electrode on the first substrate to prepare the first laminate, and separately successively forming at least the second electrode, the electroluminescent layer and the dielectric layer on the second substrate to prepare the second laminate;

Step (6): successively forming at least the first electrode, the electroluminescent layer and the dielectric layer on the first substrate to prepare the first laminate, and separately forming at least the second electrode on the second substrate to prepare the second laminate;

Step (7): successively forming at least the first electrode and the electroluminescent layer on the first substrate to prepare the first laminate, and separately successively forming at least the second electrode and the dielectric layer on the second substrate to prepare the second laminate;

Step (8): forming at least the first electrode on the first substrate to prepare the first laminate, and separately successively forming at least the second electrode, the dielectric layer and the electroluminescent layer on the second substrate to prepare the second laminate;

Step (9): successively forming at least the first electrode, the dielectric layer, the electroluminescent layer and the dielectric layer on the first substrate to prepare the first laminate, and separately forming at least the second electrode on the second substrate to prepare the second laminate;

Step (10): successively forming at least the first electrode, the dielectric layer and the electroluminescent layer on the first substrate to prepare the first laminate, and separately successively forming at least the second electrode and the dielectric layer on the second substrate to prepare the second laminate;

Step (11): successively forming at least the first electrode and the dielectric layer on the first substrate to prepare the first laminate, and separately successively forming at least the second electrode, the dielectric layer and the electroluminescent layer on the second substrate to prepare the second laminate; and Step (12): forming at least the first electrode on the first substrate to prepare the first laminate, and separately successively forming at least the second electrode, the dielectric layer, the electroluminescent layer and the dielectric layer on the second substrate to prepare the second laminate, wherein the dielectric layers formed on sides of the first electrode and the second electrode in the steps (9) to (12) may be the same or different from each other.

[8] A process for producing the electroluminescent sheet as described in the above aspect [7], wherein the dielectric layer has a pressure sensitive adhesive property.

Effect of the Invention

In accordance with the present invention, there can be provided a luminescent composition which has a pressure sensitive adhesive property and which is capable of providing an electroluminescent sheet for use in advertizing media or decorating media disposed on windows of commercial buildings and automobiles, or in security sheets, etc., with a high productivity at low costs in an efficient manner.

In addition, there can also be provided an electroluminescent sheet which can be mass-produced by forming an electroluminescent layer using the luminescent composition having a pressure sensitive adhesive property. Further, in accordance with the present invention, there can be provided a process for producing the electroluminescent sheet in an efficient manner in which the electroluminescent sheet can be mass-produced.

BEST MODE FOR CARRYING OUT THE INVENTION

First, the luminescent composition of the present invention is described.

[Luminescent Composition]

The luminescent composition of the present invention is produced by kneading and dispersing an electroluminescent substance in a resin having a glass transition temperature of from −70 to 5° C. (hereinafter referred to as a "matrix resin"), and has a pressure sensitive adhesive property.

(Matrix Resin)

It is important that the matrix resin used in the luminescent composition of the present invention exhibits a pressure sensitive adhesive property at an ordinary temperature, and allows an electroluminescent layer formed therefrom to bond to the other layers only by facing each other and applying a pressing force thereto when bonding these layers together as described hereinafter. In addition, the matrix resin has such a property capable of suppressing the electroluminescent layer from being squeezed out from an edge of the below-mentioned electroluminescent sheet (hereinafter referred to as a "squeeze-out property"). In order to exhibit the above properties, the matrix resin is required to have a glass transition temperature Tg of from −70 to 5° C., preferably from −60 to −15° C. and more preferably from to −25° C. The matrix resin having a glass transition temperature Tg of lower than −70° C. tends to hardly maintain a sufficient cohesion force and therefore tends to be squeezed out from an edge of the resulting electroluminescent sheet. The matrix resin having a glass transition temperature Tg of higher than 5° C. tends to hardly exhibit a sufficient pressure sensitive adhesive property at an ordinary temperature, thereby failing to achieve the aimed effects of the present invention.

The glass transition temperature Tg as used herein means the value of an extrapolated glass transition initiation temperature which is measured in a temperature range of from −80 to 250° C. using a power compensation differential scanning calorimeter "Pyrisl DSC" available from Perkin Elmer Inc., according to JIS K 7121.

Examples of the resin having such properties include polyester-based resins, polyurethane-based resins, silicone-based resins and acrylic resins. Among these resins, preferred are acrylic resins.

<Acrylic Resins>

The acrylic resins having a pressure sensitive adhesive property are preferably in the form of a copolymer of a (meth) acrylic acid ester whose ester moiety is constituted of an alkyl group having 1 to 20 carbon atoms with a monomer having a functional group such as a carboxyl group and the other monomer in which the monomers may be optionally used according to requirements, i.e., a (meth)acrylic acid ester copolymer. The term "(meth)acrylic acid . . ." as used in the present invention means both "acrylic acid . . ." and "methacrylic acid . . .". Examples of the (meth)acrylic acid ester whose ester moiety is constituted of an alkyl group having 1 to 20 carbon atoms include methyl(meth)acrylate, ethyl (meth)acrylate, propyl(meth)acrylate, butyl(meth)acrylate, pentyl(meth)acrylate, hexyl(meth)acrylate, cyclohexyl (meth)acrylate, 2-ethylhexyl(meth)acrylate, isooctyl(meth) acrylate, decyl(meth)acrylate, dodecyl(meth)acrylate, myristyl(meth)acrylate, palmityl(meth)acrylate and stearyl(meth) acrylate. These (meth)acrylic acid esters may be used alone or in combination of any two or more thereof.

Examples of the monomer having a functional group which may be optionally used according to requirements include ethylenically unsaturated carboxylic acids such as acrylic acid, methacrylic acid, crotonic acid, maleic acid, itaconic acid and citraconic acid; (meth)acrylic acid hydroxyalkyl esters such as 2-hydroxyethyl(meth)acrylate, 2-hydroxypropyl(meth)acrylate, 3-hydroxypropyl(meth)acrylate, 2-hydroxybutyl(meth)acrylate, 3-hydroxybutyl(meth)acrylate and 4-hydroxybutyl(meth)acrylate; and monoalkylaminoalkyl(meth)acrylates such as monomethylaminoethyl (meth)acrylate, monoethylaminoethyl(meth)acrylate, monomethylaminopropyl(meth)acrylate and monoethylaminopropyl(meth)acrylate. These monomers may be used alone or in combination of any two or more thereof.

Examples of the other monomer which may also be optionally used according to requirements include vinyl esters such as vinyl acetate and vinyl propionate; olefins such as ethylene, propylene and isobutylene; halogenated olefins such as vinyl chloride and vinylidene chloride; styrene-based monomers such as styrene and α-methyl styrene; diene-based monomers such as butadiene, isoprene and chloroprene; nitrile-based monomers such as acrylonitrile and methacrylonitrile; and acrylamides such as acrylamide, N-methyl acrylamide and N,N-dimethyl acrylamide. These other monomers may be used alone or in combination of any two or more thereof.

In the present invention, when the above acrylic resin is used as the matrix resin, the (meth)acrylic acid ester as a main component may be suitably polymerized with at least one monomer appropriately selected from the above monomers having a functional group and the above other monomers such that the resulting acrylic resin has a glass transition temperature Tg of from −70 to 5° C. The type of the resulting copolymer is not particularly limited, and may be any of a random copolymer, a block copolymer and a graft copolymer. The weight-average molecular weight of the acrylic resin is preferably 300,000 or more.

Meanwhile, the weight-average molecular weight is the value as measured in terms of a polystyrene by gel permeation chromatography (GPC).

In order to allow the above acrylic resin to maintain a pressure sensitive adhesive property at an ordinary temperature and suppress squeeze-out of the acrylic resin when bonding the electroluminescent layer to the other layers, an active hydrogen-containing functional group in the acrylic resin (such as, for example, a hydroxyl group and a carboxyl group) may be reacted with a crosslinking agent such as a polyisocyanate compound, or may be copolymerized with an internal crosslinking agent such as a polyfunctional acrylate-based monomer upon the polymerization. Meanwhile, even in such a case, it is required that the acrylic resin after being thus crosslinked has a glass transition temperature Tg of from −70 to 5° C.

In the present invention, the matrix resins may be used alone or in combination of any two or more thereof.

(Electroluminescent Substance)

In the luminescent composition of the present invention, the electroluminescent substance to be kneaded and dispersed in the matrix resin may be either an inorganic electroluminescent material or an organic electroluminescent material. Among these electroluminescent materials, in view of applications of the electroluminescent sheet according to the present invention, the inorganic electroluminescent material is preferred because of an excellent long-term stability thereof.

<Inorganic Electroluminescent Material>

The inorganic electroluminescent material used in the present invention is not particularly limited, and may be any optional material appropriately selected from conventionally known inorganic electroluminescent materials. Examples of the suitable inorganic electroluminescent material include ZnS:Cu, ZnS:Mn, ZnS:TbF$_3$, ZnS:SmF$_3$ and ZnS:TmF$_3$ which are obtained by adding each of copper, manganese, terbium fluoride, samarium fluoride and thulium fluoride as a luminescent center material to zinc sulfide (ZnS) as a base material; CaS:Eu which is obtained by adding europium as a luminescent center material to calcium sulfide (CaS) as a base material; SrS:Ce which is obtained by adding cerium as a luminescent center material to strontium sulfide (SrS) as a base material; and those inorganic materials which are respectively obtained by adding a transition metal such as manganese or a rare earth element such as europium, cerium and terbium as a luminescent center material to an alkali earth element calcium sulfide such as CaCa$_2$S$_4$ and SrCa$_2$S$_4$ as a base material.

Among these inorganic electroluminescent materials, preferred are ZnS:Cu and ZnS:TbF$_3$ as a green light-emitting material, ZnS:Mn as a yellowish orange light-emitting material, ZnS:SmF$_3$ and CaS:Eu as a red light-emitting material, and ZnS:TmF$_3$ and SrS:Ce as a blue light-emitting material.

Further examples of the inorganic electroluminescent material include oxide luminescent materials composed of Sc$_2$O$_3$ which is doped with a rare earth element other than Sc such as, for example, Y, La, Ce, Pr, Nd, Sm, Eu, Gd, Tb, Dy, Ho, Er, Tm, Yb and Lu. Among the above rare earth elements to be doped, Ce, Sm, Eu, Tb and Tm are preferably used. These inorganic electroluminescent materials is capable of emitting a yellow light, a red light having a longer wavelength than that of the yellow light, or a green or blue light having a shorter wavelength than that of the yellow light, depending upon the kind of rare earth element to be doped.

In the present invention, these inorganic electroluminescent materials may be used alone or in combination of any two or more thereof, if required.

<Organic Electroluminescent Material>

The organic electroluminescent material usable in the present invention is not particularly limited, and may be of either a low-molecular type or a high-molecular type. In addition, either a fluorescent material or a phosphorescent material may be used as the organic luminescent material.

Examples of the suitable fluorescent material as the low-molecular type organic electroluminescent material include benzoxazole derivatives, benzimidazole derivatives, benzothiazole derivatives, styryl benzene derivatives, polyphenyl derivatives, diphenyl butadiene derivatives, tetraphenyl butadiene derivatives, naphthalimide derivatives, coumarin derivatives, perylene derivatives, perinone derivatives, oxadiazole derivatives, aldazine derivatives, pyralidine derivatives, cyclopentadiene derivatives, bis(styryl)anthracene derivatives, quinacridone derivatives, pyrrolopyridine derivatives, thiadiazolopyridine derivatives, styryl amine derivatives, aromatic dimethylidene compounds, and various metal complexes typically including metal complexes or rare earth complexes of 8-quinolinol derivatives.

Examples of the phosphorescent material include ortho-metallized metal complexes (a generic name of a group of compounds described, for example, in Akio Yamamoto "ORGANIC METAL CHEMISTRY: Foundation and Applications", Shoukabou-sha, pp. 150 to 232 (1982), H. Yersin "Photochemistry and Photophysics of Coordination Compounds", Springer-Verlag, pp. 71 to 77 and 135 to 146, 1987 or the like), and porphyrin metal complexes.

On the other hand, examples of the preferred high-molecular type organic electroluminescent material include organic fluorescent materials such as polythiophene derivatives, polyphenylene derivatives, polyphenylene vinylene derivatives and polyfluorene derivatives.

The organic electroluminescent material used in the present invention may be one material selected from the above low-molecular type and high-molecular type organic electroluminescent materials, or combination of any two or more thereof.

Meanwhile, when the below-mentioned electroluminescent layer is made of such an organic electroluminescent material, it is preferred that a hole injecting and transporting layer be laminated on an anode-side surface thereof and an electron injecting and transporting layer be laminated on a cathode-side surface thereof.

In the luminescent composition of the present invention, when the electroluminescent substance used therein is in the form of particles, from the viewpoint of uniform dispersibility in the resin, the particles preferably have an average particle size of from 1 to 100 μm, more preferably from 10 to 60 μm, and still more preferably from 20 to 50 μm.

The content of the electroluminescent substance in the luminescent composition of the present invention may vary depending upon which of an inorganic material and an organic material is used therefor. In the case where the inorganic material is used as the electroluminescent substance, from the viewpoint of good balance between luminescence, a pressure sensitive adhesive property and economy, the content of the electroluminescent substance in the luminescent composition is usually from about 20 to about 400 parts by mass, preferably from 100 to 300 parts by mass and more preferably from 150 to 250 parts by mass on the basis of 100 parts by mass of the matrix resin.

(Precipitation Inhibitor)

The luminescent composition of the present invention may contain a precipitation inhibitor in order to enhance a dispersibility of the electroluminescent substance and prevent precipitation of the electroluminescent substance, in particular, when the electroluminescent substance is composed of the inorganic electroluminescent material. Examples of the precipitation inhibitor include polyethylene oxide-based compounds, hydrogenated castor oils and higher fatty acid amides. Specific examples of the preferred precipitation inhibitor include higher fatty acid amides such as oleamide, stearamide, capronic amide, linoleic amide, N,N'-methylene-bis(stearamide) and N,N'-ethylene-bis(stearamide), and composite materials of these higher fatty acid amides and waxes. The content of the precipitation inhibitor in the luminescent composition is usually from about 0.1 to about 5 parts by mass and preferably from 0.2 to 4 parts by mass in terms of a solid content thereof on the basis of 100 parts by mass of the matrix resin from the viewpoint of good balance between precipitation-inhibiting effect and economy. These precipitation inhibitors may be used alone or in combination of any two or more thereof.

(Fluorescent Substance and Pigment)

The luminescent composition of the present invention preferably contains at least one material selected from the group consisting of a fluorescent substance and a pigment for the purpose of controlling a luminescent color to be emitted therefrom.

<Fluorescent Substance>

The fluorescent substance used in the luminescent composition of the present invention may be appropriately selected from conventionally known fluorescent substances in view of the luminescent color to be emitted therefrom. Examples of a suitable fluorescent coloring matter which is capable of absorbing a light of from blue to bluish green-color range emitted from the luminescent substance and generating a fluorescence of a green-color range, include coumarin-based coloring matter such as 2,3,5,6-1H,4H-tetrahydro-8-trifluoromethyl quinolizine (9,9a,1-gh)coumarin (coumarin 153), 3-(2'-benzothiazolyl)-7-diethylaminocoumarin (coumarin 6), 3-(2'-benzimidazolyl)-7-N,N-diethylaminocoumarin (coumarin 7) and 3-(2'-N-methylbenzimidazolyl)-7-N,N-diethylaminocoumarin (coumarin 30); and naphthalimide-based coloring matter such as Solvent Yellow 11 and Solvent Yellow 116.

Examples of a suitable fluorescent coloring matter which is capable of absorbing a light of from blue to bluish green-color range emitted from the luminescent substance and generating a fluorescence of a red-color range, include cyanine-based coloring matter such as 4-dicyanomethylene-2-methyl-6-(p-dimethylaminostyryl)-4H-pyran (DCM); pyridine-based coloring matter such as 1-ethyl-2-[4-(p-dimethylaminophenyl)-1,3-butadienyl)-pyridinium-perchlorate (pyridine 1); rhodamine-based coloring matter such as rhodamine B, rhodamine 6G, rhodamine 3B, rhodamine 101, rhodamine 110, sulfo-rhodamine, Basic Violet 11 and Basic Red 2; and oxazoline-based coloring matter. In addition, the fluorescent coloring matter may also be used in the form of a fluorescent pigment which is obtained by previously kneading the fluorescent coloring matter in a poly(methacrylic acid ester), a polyvinyl chloride, a vinyl chloride-vinyl acetate copolymer resin, an alkyd resin, an aromatic sulfone amide resin, a urea resin, a melamine resin, a benzoguanamine resin or a resin mixture of these resins.

The content of the fluorescent substance in the luminescent composition is preferably from 1 to 50 parts by mass and more preferably from 3 to 20 parts by mass on the basis of 100 parts by mass of the electroluminescent substance used therein. These fluorescent coloring matter or fluorescent pigments may be used alone or in combination of any two or more thereof, if required.

<Pigment>

The pigment used in the luminescent composition of the present invention may be appropriately selected from conventionally known pigments according to the luminescent color to be emitted therefrom. Examples of the suitable pigment include inorganic pigments such as titanium white, zinc white, rouge, vermilion, ultramarine blue, cobalt blue, titan yellow and chrome yellow; and organic pigments such as isoindolinone, Hansa yellow A, quinacridone, Permanent Red 4R, phthalocyanine blue and indanthrene blue RS.

The content of the pigment in the luminescent composition is preferably from 1 to 50 parts by mass and more preferably from 3 to 20 parts by mass on the basis of 100 parts by mass of the electroluminescent substance used therein.

(Ultraviolet Absorber and Infrared Absorber)

The luminescent composition of the present invention preferably contains at least one material selected from the group consisting of an ultraviolet absorber and an infrared absorber for the purpose of enhancing a weather resistance of the luminescent composition.

<Ultraviolet Absorber>

The ultraviolet absorber used in the luminescent composition of the present invention may be appropriately selected from conventionally known ultraviolet absorbers. Examples of the suitable ultraviolet absorber include 2'-hydroxyphenyl-5-chlorobenzotriazole-based ultraviolet absorbers such as 2-(2'-hydroxy-3',5'-di-tert-butylphenyl)-5-chlorobenzotriazole, 2-(2'-hydroxy-3'-tert-butyl-5'-methylphenyl)-5-chlorobenzotriazole, 2-(2'-hydroxy-3'-tert-amyl-5'-isobutylphenyl)-5-chlorobenzotriazole, 2-(2'-hydroxy-3'-isobutyl-5'-methylphenyl)-5-chlorobenzotriazole and 2-(2'-hydroxy-3' isobutyl-5'-propylphenyl)-5-chlorobenzotriazole; 2'-hydroxyphenyl benzotriazole-based ultraviolet absorbers such as 2-(2'-hydroxy-3',5'-di-tert-butylphenyl)benzotriazole and 2-(2'-hydroxy-5'-methylphenyl)benzotriazole; 2,2'-dihydroxybenzophenone-based ultraviolet absorbers such as 2,2'-dihydroxy-4-methoxybenzophenone, 2,2'-dihydroxy-4,4'-dimethoxybenzophenone and 2,2',4,4'-tetrahydroxybenzophenone; 2-hydroxybenzophenone-based ultraviolet absorbers such as 2-hydroxy-4-methoxybenzophenone and 2,4-dihydroxybenzophenone; salicylic acid ester-based ultraviolet absorbers such as phenyl salicylate and 4-tert-butyl phenyl salicylate; and cyanoacrylate-based ultraviolet absorbers such as 2-ethyl-hexyl-2-cyano-3,3-diphenyl acrylate, ethyl-2-cyano-3,3-diphenyl acrylate and octyl-2-cyano-3,3-diphenyl acrylate, as well as reactive ultraviolet absorbers obtained by introducing an acryloyl group or a methacryloyl group into a benzotriazole skeleton.

The content of the ultraviolet absorber in the luminescent composition is preferably from 0.5 to 20 parts by mass and more preferably from 1 to 10 parts by mass on the basis of 100 parts by mass of the matrix resin.

<Infrared Absorber>

The infrared absorber used in the luminescent composition of the present invention may be appropriately selected from conventionally known infrared absorbers such as organic infrared absorbers and inorganic infrared absorbers.

Examples of the organic infrared absorber include phthalocyanine, naphthalocyanine, anthraquinone, cyanine compounds, squarylium compounds, thiol-nickel complex compounds, triaryl methanes, naphthoquinone, anthraquinone, and amine compounds such as N,N,N',N'-tetrakis(p-di-n-butylaminophenyl)-p-phenylenediaminium perchlorate, phenylenediaminium chlorate, phenylenediaminium hexafluoroantimonate, phenylenediaminium fluoroborate and phenylenediaminium fluorate.

Examples of the suitable inorganic infrared absorber include oxides, nitrides, carbides, oxynitrides and sulfides of metals such as Sn, Ti, Si, Zn, Zr, Fe, Al, Cr, Co, Ce, In, Ni, Ag, Cu, Pt, Nn, Ta, W, V and Mo. Among these compounds, preferred are ITO (indium tin oxide), ATO (antimony tin oxide), $SnO_2$, $TiO_2$, $SiO_2$, $ZrO_2$, ZnO, $Fe_2O_3$, $Al_2O_3$, FeO, $Cr_2O_3$, $Co_2O_3$, $CeO_2$, $In_2O_3$, NiO, MnO and CuO.

The content of the infrared absorber in the luminescent composition is preferably from 0.5 to 20 parts by mass and more preferably from 1 to 10 parts by mass on the basis of 100 parts by mass of the matrix resin.

Further, the luminescent composition of the present invention may also contain, if required, various additives other than those described above, for example, an antioxidant, a light stabilizer, a tackifier, etc., unless addition of these additives adversely affects the aimed effects of the present invention.
(Preparation of Luminescent Composition)

The method for preparing the luminescent composition of the present invention is not particularly limited as long as the above electroluminescent substance can be uniformly dispersed or dissolved, if required, together with the precipitation inhibitor as well as various other additives as optional components, in the matrix resin having a pressure sensitive adhesive.

Thus, the luminescent composition having a pressure sensitive adhesive property of the present invention can be obtained.

The thus obtained luminescent composition can be used in an electroluminescent layer of the below-mentioned electroluminescent sheet which serves as a backlight for advertizing media and decorating media disposed on windows of commercial buildings or automobiles, or security sheets, etc., and further can provide the electroluminescent sheet with a high productivity at low costs in an efficient manner.

Next, the electroluminescent sheet according to the present invention is described.

[Electroluminescent Sheet]

The electroluminescent sheet according to the present invention includes at least a first substrate, a first electrode, an electroluminescent layer, a second electrode and a second substrate which are successively laminated in this order. The first substrate and the first electrode are transparent, and the electroluminescent layer is formed from the luminescent composition having a pressure sensitive adhesive property of the present invention as described above.

(First Substrate and Second Substrate)

In the electroluminescent sheet of the present invention, the first substrate forms a luminescent surface of the sheet, and the second substrate forms a rear surface opposed to the luminescent surface. The first substrate and the second substrate may be respectively constituted of a plastic film. The plastic films used for the first substrate and the second substrate both are preferably in the form of a water-impermeable film or a film having a very low water permeability. It is important that the first substrate further has a good transparency. As the material of such a film, polyesters and polyamides are preferably used from the viewpoints of low costs and good flexibility Examples of the polyesters include polyethylene terephthalate, polybutylene terephthalate, polyethylene naphthalate and polyarylates. Examples of the polyamides include all aromatic polyamides such as nylon 6, nylon 66 and nylon copolymers. The thickness of the substrate film used in the electroluminescent sheet is not particularly limited, and is usually from 1 to 1000 μm and preferably from 5 to 500 μm, and further is more preferably from 50 to 200 μm in view of practical use.

Meanwhile, it is not particularly required that the second substrate is transparent. As the second substrate, in addition to the above-mentioned substrate, there may also be used a film made of polystyrene, polyimides or polyvinyl chloride, a film prepared by mixing a pigment in the above plastic film, and a metal foil such as an aluminum foil and a copper foil.

The first substrate may have either a colorless transparency or a colored transparency. However, the first substrate is preferably colorless transparent from the viewpoint of preventing scattering or attenuation of light emitted from the below-mentioned electroluminescent layer.

Also, the first substrate and the second substrate may be respectively provided on its front or rear surface with a moisture permeation-preventing layer (gas barrier layer). As the material of the moisture permeation-preventing layer (gas barrier layer), there may be suitably used inorganic materials such as silicon nitride and silicon oxide. The moisture permeation-preventing layer (gas barrier layer) may be formed, for example, by a high-frequency sputtering method, etc.

(First Electrode)

The first electrode (anode) used in the electroluminescent sheet of the present invention is not particularly limited as long as it has a suitable function as the anode and is formed of a transparent electrode, and may be appropriately selected from conventionally known anodes depending upon the aimed applications of the electroluminescent sheet. Examples of the suitable material of the first electrode include metals, alloys, metal oxides, organic conductive compounds and mixtures thereof. Among these materials, preferred are those materials having a work function of 4.0 eV or more. Specific examples of the materials having a work function of 4.0 eV or more include semiconducting metal oxides such as tin oxide doped with antimony or fluorine (such as ATO and FTO), tin oxide, zinc oxide, indium oxide, indium tin oxide (ITO) and indium zinc oxide (IZO); metals such as gold, silver, chromium and nickel, as well as mixtures or laminates of these metals and conductive metal oxides; inorganic conductive substances such as copper iodide and copper sulfide; and organic conductive materials such as polyaniline, polythiophene and polypyrrole, as well as laminates of these materials and ITO. The first electrode is especially preferably formed of ITO.

The first electrode may be formed on the first substrate by a suitable method which is appropriately selected from, for example, wet methods such as a printing method and a coating method, physical methods such as a vacuum deposition method, a sputtering method and an ion-plating method and chemical methods such as CVD and plasma CVD, in view of suitability and compatibility with the material used. For example, in the case where ITO is selected and used as the material of the first electrode, the first electrode may be formed by a DC or high-frequency sputtering method, a vacuum deposition method, an ion-plating method, etc. On the other hand, in the case where the organic conductive compound is selected and used as the material of the first electrode, the first electrode may be formed by a wet film-forming method.

The thickness of the first electrode may be appropriately determined according to the material thereof and is therefore not particularly limited, and is usually from 10 to 1000 nm, preferably from 20 to 500 nm and more preferably from 50 to 200 nm.

The resistance value of the first electrode is preferably $10^3 \Omega/\square$ or less and more preferably $10^2 \Omega/\square$ or less.

The first electrode may have either a colorless transparency or a colored transparency, and is preferably colorless transparent. In order to allow emission of light from a side of the first electrode, a laminate composed of the first substrate and the first electrode preferably has a light transmittance of 60% or more, and more preferably 70% or more. The light transmittance may be measured by known methods using a spectrophotometer.

(Second Electrode)

The second electrode (cathode) used in the electroluminescent sheet of the present invention is not particularly limited as long as it has a suitable function as the cathode, and may be appropriately selected from known cathodes according to the aimed applications of the electroluminescent sheet.

Examples of the material of the second electrode include metals, alloys, metal oxides, electrically conductive compounds and mixtures thereof. Among these materials, preferred are those materials having a work function of 4.5 eV or less. Specific examples of the materials having a work function of 4.5 eV or less include alkali metals (such as, for example, Li, Na, K and Cs), alkali earth metals (such as, for example, Mg and Ca), gold, silver, lead, aluminum, sodium-potassium alloy, lithium-aluminum alloy, magnesium-silver alloy, indium, and rare earth metals such as ytterbium. These materials may be used alone or in combination of any two or more thereof.

Among these materials, from the viewpoint of excellent maintenance stability, preferred are those materials composed mainly of aluminum. The term "material composed mainly of aluminum" means not only a material composed of aluminum singly, but also a material composed of a mixture or alloy containing aluminum and from about 0.01 to about 10% by mass of an alkali metal or an alkali earth metal (such as, for example, lithium-aluminum alloy and magnesium-aluminum alloy).

The method for forming the second electrode is not particularly limited, and the second electrode may be formed by known methods. The second electrode may be formed on the second substrate by a suitable method which is appropriately selected from, for example, wet methods such as a printing method and a coating method, physical methods such as a vacuum deposition method, a sputtering method and an ion-plating method and chemical methods such as CVD and plasma CVD, in view of suitability and compatibility with the material used. For example, in the case where the metal, etc., are selected and used as the material of the second electrode, the second electrode may be formed by sputtering one or more kinds of metals, etc., in a simultaneous or sequential manner.

The thickness of the second electrode may be appropriately determined according to the material thereof and therefore is not particularly limited, and is usually from 10 to 1000 nm, preferably from 20 to 500 nm and more preferably from 50 to 200 nm. The second electrode may be either transparent or opaque.

(Electroluminescent Layer)

In the electroluminescent sheet of the present invention, the electroluminescent layer is formed on the first or second electrode or on the below-mentioned dielectric layer by applying the above luminescent composition having a pressure sensitive adhesive property of the present invention thereonto.

The coating method of the luminescent composition is not particularly limited, and there may be used conventionally known methods such as, for example, a knife coating method, a roll coating method, a bar coating method, a blade coating method, a die coating method and a gravure coating method.

The thickness of the thus obtained electroluminescent layer is usually from about 0.1 to about 100 μm, preferably from 5 to 90 μm and more preferably from 20 to 80 μm from the viewpoint of enhancing adhesion of the electroluminescent layer to other layers and suppressing squeeze-out thereof from the sheet.

As described above, when the electroluminescent layer is made of an organic electroluminescent material, it is preferred that a hole injecting and transporting layer be provided on a first electrode-side surface of the electroluminescent layer and an electron injecting and transporting layer be provided on a second electrode-side surface thereof.

(Dielectric Layer)

In the electroluminescent sheet of the present invention, in order to enhance a luminous efficiency thereof, a dielectric layer containing a dielectric material may be provided between the first electrode and the electroluminescent layer and/or between the electroluminescent layer and the second electrode.

Examples of the dielectric material include $SiO_2$, $BaTiO_3$, SiON, $Al_2O_3$, $TiO_2$, $Si_3N_4$, SiAlON, $Y_2O_3$, $Sm_2O_3$, $Ta_2O_5$, $BaTa_2O_3$, $PbNb_2O_3$, $Sr(Zr, Ti)O_3$, $SrTiO_3$, $PbTiO_3$ and $HfO_3$. These dielectric materials may be used alone or in combination of any two or more thereof. When the dielectric layer is provided on a side of the first electrode, it is necessary that the dielectric layer is transparent. Therefore, in such a case, among these dielectric materials, preferred are inorganic materials such as $SiO_2$, $Al_2O_3$, $Si_3N_4$, $Y_2O_3$, $Ta_2O_5$, $BaTa_2O_3$, $SrTiO_3$ and $PbTiO_3$. The other organic materials such as curable resins and thermoplastic resins as single materials may also be used as the dielectric material. When the dielectric layer is provided on a side of the second electrode, it is not particularly required that the dielectric layer is transparent, and any pigment may be added to the above material, if required.

The dielectric layer may be formed by applying a coating material prepared by uniformly dispersing the above dielectric material in an adequate binder resin by conventionally known coating methods such as, for example, a spray coating method, a knife coating method, a roll coating method, a bar coating method, a blade coating method, a die coating method and a gravure coating method or by using an extruder. Meanwhile, the dielectric material made of an organic material may be directly applied as such without using any binder resin.

The dielectric layer can exhibit its controlling effect in the case where a sufficient voltage is hardly applied to the electroluminescent layer owing to an excessively high electric conductivity of the electroluminescent layer when operating the electroluminescent sheet of the present invention by supplying an alternate current thereto or in the case where dielectric breakdown tends to occur owing to overcurrent. The thickness of the dielectric layer is usually from about 0.1 to about 100 μm and preferably from 10 to 50 μm from the viewpoint of allowing the dielectric layer to exhibit the above controlling effect.

Meanwhile, as described in more detail in the below-mentioned process for production of the electroluminescent sheet, from the viewpoint of facilitated production of the electroluminescent sheet, etc., it is advantageous that the dielectric layer has a pressure sensitive adhesive property, depending upon the position where the dielectric layer is provided.

In this case, the resin having a pressure sensitive adhesive mentioned above as the matrix resin of the above luminescent composition may be used as the binder resin for the dielectric layer.

Next, the process for producing the electroluminescent sheet according to the present invention is described.

[Process for Producing Electroluminescent Sheet]

According to the production process of the present invention, a first laminate and a second laminate are prepared by the following step (1) or (2), and then a side of the electroluminescent layer of the first laminate is bonded to a side of the second electrode of the second laminate, or a side of the first electrode of the first laminate is bonded to a side of the electroluminescent layer of the second laminate, to thereby obtain the electroluminescent sheet of the present invention having the construction shown in FIG. 1.

Step (1): successively forming at least the first electrode and the electroluminescent layer on the first substrate to prepare the first laminate, and separately forming at least the second electrode on the second substrate to prepare the second laminate; or Step (2): forming at least the first electrode on the first substrate to prepare the first laminate, and separately successively forming at least the second electrode and the electroluminescent layer on the second substrate to prepare the second laminate.

In the production process of the present invention, the construction of each of the first laminate and the second laminate is illustrated by the following symbols.

That is, the first substrate, the second substrate, the first electrode, the second electrode and the electroluminescent layer are represented by "1", "2", "$E^1$", "$E^2$" and "L", respectively. In addition, the below-mentioned dielectric layer is represented by "D".

In the method using the above step (1), the obtained first laminate has a construction of 1-$E^1$-L, and the obtained second laminate has a construction of 2-$E^2$. The first laminate and the second laminate are faced each other such that $E^1$ is opposed to L, and then pressed and bonded together to obtain an electroluminescent sheet (a) having a construction of 1-$E^1$-L-$E^2$-2.

Also, in the method using the above step (2), the obtained first laminate has a construction of 1-$E^1$, and the obtained second laminate has a construction of 2-$E^2$-L. The first laminate and the second laminate are faced each other such that $E^1$ is opposed to L, and then pressed and bonded together to obtain an electroluminescent sheet (a) having a construction of 1-$E^1$-L-$E^2$-2.

In FIG. 1, there is shown a schematic sectional view of the construction of the electroluminescent sheet (a). Also, the constructions of the first laminate, the second laminate and the resulting electroluminescent sheet when using each of the steps (1) and (2) are shown in Table 1.

Alternatively, in the production process of the present invention, the first laminate and the second laminate are prepared by any one of the following steps (3) to (12); and then a side of the dielectric layer, the electroluminescent layer or the first electrode of the first laminate is bonded to a side of the second electrode, the electroluminescent layer or the dielectric layer of the second laminate, to thereby obtain the electroluminescent sheet of the present invention having a construction shown in FIG. 2, 3 or 4.

Step (3): successively forming at least the first electrode, the dielectric layer and the electroluminescent layer on the first substrate to prepare the first laminate, and separately forming at least the second electrode on the second substrate to prepare the second laminate;

Step (4): successively forming at least the first electrode and the dielectric layer on the first substrate to prepare the first laminate, and separately successively forming at least the second electrode and the electroluminescent layer on the second substrate to prepare the second laminate;

Step (5): forming at least the first electrode on the first substrate to prepare the first laminate, and separately successively forming at least the second electrode, the electroluminescent layer and the dielectric layer on the second substrate to prepare the second laminate;

Step (6): successively forming at least the first electrode, the electroluminescent layer and the dielectric layer on the first substrate to prepare the first laminate, and separately forming at least the second electrode on the second substrate to prepare the second laminate;

Step (7): successively forming at least the first electrode and the electroluminescent layer on the first substrate to prepare the first laminate, and separately successively forming at least the second electrode and the dielectric layer on the second substrate to prepare the second laminate;

Step (8): forming at least the first electrode on the first substrate to prepare the first laminate, and separately successively forming at least the second electrode, the dielectric layer and the electroluminescent layer on the second substrate to prepare the second laminate;

Step (9): successively forming at least the first electrode, the dielectric layer, the electroluminescent layer and the dielectric layer on the first substrate to prepare the first laminate, and separately forming at least the second electrode on the second substrate to prepare the second laminate;

Step (10): successively forming at least the first electrode, the dielectric layer and the electroluminescent layer on the first substrate to prepare the first laminate, and separately successively forming at least the second electrode and the dielectric layer on the second substrate to prepare the second laminate;

Step (11): successively forming at least the first electrode and the dielectric layer on the first substrate to prepare the first laminate, and separately successively forming at least the second electrode, the dielectric layer and the electroluminescent layer on the second substrate to prepare the second laminate; and Step (12): forming at least the first electrode on the first substrate to prepare the first laminate, and separately successively forming at least the second electrode, the dielectric layer, the electroluminescent layer and the dielectric layer on the second substrate to prepare the second laminate, wherein the dielectric layers formed on sides of the first electrode and the second electrode in the steps (9) to (12) may be the same or different from each other.

In the method using the above step (3), the obtained first laminate has a construction of 1-$E^1$-D-L, and the obtained second laminate has a construction of 2-$E^2$. The first laminate and the second laminate are faced each other such that L is opposed to $E^2$, and then pressed and bonded together to obtain an electroluminescent sheet (b) having a construction of 1-$E^1$-D-L-$E^2$-2.

In the method using the above step (4), the obtained first laminate has a construction of 1-$E^1$-D, and the obtained second laminate has a construction of 2-$E^2$-L. The first laminate and the second laminate are faced each other such that D is opposed to L, and then pressed and bonded together to obtain the electroluminescent sheet (b) having a construction of 1-$E^1$-D-L-$E^2$-2.

In the method using the above step (5), the obtained first laminate has a construction of 1-$E^1$, and the obtained second laminate has a construction of 2-$E^2$-L-D. The first laminate and the second laminate are faced each other such that $E^1$ is opposed to D, and then pressed and bonded together to obtain the electroluminescent sheet (b) having a construction of 1-$E^1$-D-L-$E^2$-2. In this case, the dielectric layer D is bonded to the first electrode $E^1$, and therefore preferably has a pressure sensitive adhesive property.

In the method using the above step (6), the obtained first laminate has a construction of 1-$E^1$-L-D, and the obtained second laminate has a construction of 2-$E^2$. The first laminate and the second laminate are faced each other such that D is opposed to $E^2$, and then pressed and bonded together to obtain an electroluminescent sheet (c) having a construction of 1-$E^1$-L-D-$E^2$-2. In this case, the dielectric layer D is bonded to the second electrode, and therefore preferably has a pressure sensitive adhesive property.

In the method using the above step (7), the obtained first laminate has a construction of 1-$E^1$-L, and the obtained second laminate has a construction of 2-$E^2$-D. The first laminate and the second laminate are faced each other such that L is opposed to D, and then pressed and bonded together to obtain the electroluminescent sheet (c) having a construction of 1-$E^1$-L-D-$E^2$-2.

In the method using the above step (8), the obtained first laminate has a construction of 1-$E^1$, and the obtained second laminate has a construction of 2-$E^2$-D-L. The first laminate and the second laminate are faced each other such that $E^1$ is opposed to L, and then pressed and bonded together to obtain the electroluminescent sheet (c) having a construction of 1-$E^1$-L-D-$E^2$-2.

In the method using the above step (9), the obtained first laminate has a construction of 1-$E^1$-D-L-D', and the obtained second laminate has a construction of 2-$E^2$. The first laminate and the second laminate are faced each other such that D' is opposed to $E^2$, and then pressed and bonded together to obtain an electroluminescent sheet (d) having a construction of 1-$E^1$-D-L-D'-$E^2$-2. In this case, the dielectric layer D and the dielectric layer D' may be the same or different from each other. In addition, the dielectric layer D' is bonded to the second electrode $E^2$, and therefore preferably has a pressure sensitive adhesive property.

In the method using the above step (10), the obtained first laminate has a construction of 1-$E^1$-D-L, and the obtained second laminate has a construction of 2-$E^2$-D'. The first laminate and the second laminate are faced each other such that L is opposed to D', and then pressed and bonded together to obtain the electroluminescent sheet (d) having a construction of 1-$E^1$-D-L-D'-$E^2$-2. In this case, the dielectric layer D and the dielectric layer D' may be the same or different from each other.

In the method using the above step (11), the obtained first laminate has a construction of 1-$E^1$-D, and the obtained second laminate has a construction of 2-$E^2$-D'-L. The first laminate and the second laminate are faced each other such that D is opposed to L, and then pressed and bonded together to obtain the electroluminescent sheet (d) having a construction of 1-$E^1$-D-L-D'-$E^2$-2. In this case, the dielectric layer D and the dielectric layer D' may be the same or different from each other.

In the method using the above step (12), the obtained first laminate has a construction of 1-$E^1$, and the obtained second laminate has a construction of 2-$E^2$-D'-L-D. The first laminate and the second laminate are faced each other such that $E^1$ is opposed to D, and then pressed and bonded together to obtain the electroluminescent sheet (d) having a construction of 1-$E^1$-D-L-D'-$E^2$-2. In this case, the dielectric layer D and the dielectric layer D' may be the same or different from each other. In addition, the dielectric layer D is bonded to the first electrode $E^1$, and therefore preferably has a pressure sensitive adhesive property.

In FIGS. 2, 3 and 4, there are respectively shown schematic sectional views of the constructions of the above electroluminescent sheets (b), (c) and (d).

In addition, the constructions of the first laminate, the second laminate and the resulting electroluminescent sheet when using each of the steps (3) to (12) are shown in Table 1.

TABLE 1

| Steps | First laminate Construction | Second laminate Construction | Electroluminescent sheet Construction | Kind |
|---|---|---|---|---|
| (1) | 1-$E^1$-L | 2-$E^2$ | 1-$E^1$-L-$E^2$-2 | (a) |
| (2) | 1-$E^1$ | 2-$E^2$-L | 1-$E^1$-L-$E^2$-2 | (a) |
| (3) | 1-$E^1$-D-L | 2-$E^2$ | 1-$E^1$-D-L-$E^2$-2 | (b) |
| (4) | 1-$E^1$-D | 2-$E^2$-L | 1-$E^1$-D-L-$E^2$-2 | (b) |

TABLE 1-continued

| Steps | First laminate Construction | Second laminate Construction | Electroluminescent sheet Construction | Kind |
|---|---|---|---|---|
| (5) | 1-$E^1$ | 2-$E^2$-L-D | 1-$E^1$-D-L-$E^2$-2 | (b) |
| (6) | 1-$E^1$-L-D | 2-$E^2$ | 1-$E^1$-L-D-$E^2$-2 | (c) |
| (7) | 1-$E^1$-L | 2-$E^2$-D | 1-$E^1$-L-D-$E^2$-2 | (c) |
| (8) | 1-$E^1$ | 2-$E^2$-D-L | 1-$E^1$-L-D-$E^2$-2 | (c) |
| (9) | 1-$E^1$-D-L-D' | 2-$E^2$ | 1-$E^1$-D-L-D'-$E^2$-2 | (d) |
| (10) | 1-$E^1$-D-L | 2-$E^2$-D' | 1-$E^1$-D-L-D'-$E^2$-2 | (d) |
| (11) | 1-$E^1$-D | 2-$E^2$-D'-L | 1-$E^1$-D-L-D'-$E^2$-2 | (d) |
| (12) | 1-$E^1$ | 2-$E^2$-D'-L-D | 1-$E^1$-D-L-D'-$E^2$-2 | (d) |

The process for producing the electroluminescent sheet according to the present invention is not limited to the above embodiment in which the respective layers thereof are divided into two parts including the first laminate and the second laminate. According to the present invention, it is also possible to produce the electroluminescent sheet by dividing the respective layers into 3 to 5 parts using the methods described in above-mentioned production process.

In accordance with the above production process of the present invention, by forming the electroluminescent layer from the luminescent composition having a pressure sensitive adhesive property and further, if required, allowing the dielectric layer to have a pressure sensitive adhesive property, it is possible to produce the electroluminescent sheet having a desired construction with a good productivity in an extremely convenient manner. Therefore, the production process of the present invention is suitable for mass-production of the electroluminescent sheet.

The electroluminescent sheet of the present invention can be mass-produced and can be suitably used, for example, as a back light for advertizing media and decorating media which are disposed on windows of commercial buildings or automobiles, or security sheets, etc.

EXAMPLES

Next, the present invention is described in more detail by referring to the following Examples. However, these Examples are only illustrative and not intended to limit the invention thereto.

Meanwhile, the glass transition temperature Tg of the respective acrylic resins obtained in the Examples was measured by the following method.

<Measurement of Glass Transition Temperature Tg>

The glass transition temperature (Tg) of the acrylic resin was determined from an extrapolated glass transition initiation temperature which was measured in a temperature range of from −80 to 250° C. using a power compensation differential scanning calorimeter "Pyris1 DSC" available from Perkin Elmer Inc., according to JIS K 7121.

In addition, the luminance described in the respective Examples was measured by the following method.

<Measurement of Luminance>

The luminance of light emitted from the electroluminescent sheet when operating the sheet under the conditions of 200 V and 2000 Hz was measured using a luminance meter "LS-100" available from Konica Minolta Corp.

Production Example 1

Production of First Electrode with Substrate

Using a winding type sputtering apparatus, an electric power of 1500 W was applied to an ITO target in an argon/ oxygen atmosphere under a chamber inner pressure of 2.0× $10^{-1}$ Pa at a line speed of 0.2 m/min to form an ITO transparent conductive film having a thickness of 50 nm on a transparent polyethylene naphthalate (PEN) film having a width of 350 mm and a thickness of 100 μm ("Q65FA" available from Teijin DuPont Co., Ltd.), thereby obtaining a first electrode with a substrate. Incidentally, a magnetron type sputtering apparatus available from Rock Giken Kogyo Co., Ltd., was used as the winding type sputtering apparatus.

Production Example 2

Production of Second Electrode with Substrate

Using the winding type sputtering apparatus, an electric power of 2500 W was applied to an Al target in an argon atmosphere under a chamber inner pressure of 2.0×$10^{-1}$ Pa at a line speed of 0.2 m/min to form an Al thin film having a thickness of 50 nm on a PEN film having a width of 350 mm and a thickness of 100 μm ("Q65FA" available from Teijin DuPont Co., Ltd.), thereby obtaining a second electrode with a substrate.

Example 1

Two hunched parts by mass of an electroluminescent (EL) substance composed of ZnS.Cu ("GGS42 Green" available from Osram Sylvania Corp.; average particle size: 25 μm) were added to 100 parts by mass (in terms of a solid component) of an acrylic resin (copolymer of n-butyl acrylate and acrylic acid (80/20); weight-average molecular weight: 700,000; Tg=−34° C.) and uniformly dispersed therein to prepare a luminescent composition having a pressure sensitive adhesive property.

Next, the thus prepared luminescent composition was applied onto the second electrode with the substrate obtained in Production Example 2 using a knife coater, and then dried at 110° C. for 2 min to form an electroluminescent layer having a thickness of 50 μm, thereby obtaining a second laminate. Then, the thus obtained second laminate was faced on the first electrode with the substrate obtained in Production Example 1 such that the electroluminescent layer was opposed to the first electrode, and then pressed and bonded thereto to produce an electroluminescent sheet.

As a result of subjecting the resulting electroluminescent sheet to luminance measurement, it was confirmed that the luminance thereof was 98 cd/m$^2$.

Example 2

Two hundred parts by mass of an electroluminescent (EL) substance composed of ZnS.Cu ("GGS42 Green" available from Osram Sylvania Corp.; average particle size: 25 μm) were added to 100 parts by mass (in terms of a solid component) of an acrylic resin (copolymer of n-butyl acrylate and acrylic acid (90/10); weight-average molecular weight: 700,000; Tg=−45° C.) and uniformly dispersed therein to prepare a luminescent composition having a pressure sensitive adhesive property.

Next, the thus prepared luminescent composition was applied onto the second electrode with the substrate obtained in Production Example 2 using a knife coater, and then dried at 110° C. for 2 min to form an electroluminescent layer having a thickness of 50 μm, thereby obtaining a second laminate. Then, the thus obtained second laminate was faced on the first electrode with the substrate obtained in Production Example 1 such that the electroluminescent layer was opposed to the first electrode, and then pressed and bonded thereto to produce an electroluminescent sheet.

As a result of subjecting the resulting electroluminescent sheet to luminance measurement, it was confirmed that the luminance thereof was 140 cd/m$^2$.

Example 3

Two hundred parts by mass of an electroluminescent (EL) substance composed of ZnS.Cu ("GGS42 Green" available from Osram Sylvania Corp.; average particle size: 25 μm) were added to 100 parts by mass (in terms of a solid component) of an acrylic resin (copolymer of n-butyl acrylate and 2-hydroxyethyl acrylate (95/5); weight-average molecular weight: 710,000; Tg=−52° C.) and uniformly dispersed therein to prepare a luminescent composition having a pressure sensitive adhesive property.

Next, the thus prepared luminescent composition was applied onto the second electrode with the substrate obtained in Production Example 2 using a knife coater, and then dried at 110° C. for 2 min to form an electroluminescent layer having a thickness of 50 μm, thereby obtaining a second laminate. Then, the thus obtained second laminate was faced on the first electrode with the substrate obtained in Production Example 1 such that the electroluminescent layer was opposed to the first electrode, and then pressed and bonded thereto to produce an electroluminescent sheet.

As a result of subjecting the resulting electroluminescent sheet to luminance measurement, it was confirmed that the luminance thereof was 120 cd/m$^2$.

Example 4

Two hundred parts by mass of an electroluminescent (EL) substance composed of ZnS.Cu ("GGS42 Green" available from Osram Sylvania Corp.; average particle size: 25 μm) were added to 100 parts by mass (in terms of a solid component) of an acrylic resin (copolymer of 2-ethylhexyl acrylate, ethyl acrylate, vinyl acetate and acrylamide (56/27/17/2); weight-average molecular weight: 700,000; Tg=−56° C.) and uniformly dispersed therein to prepare a luminescent composition having a pressure sensitive adhesive property.

Next, the thus prepared luminescent composition was applied onto the second electrode with the substrate obtained in Production Example 2 using a knife coater, and then dried at 110° C. for 2 min to form an electroluminescent layer having a thickness of 50 μm, thereby obtaining a second laminate. Then, the thus obtained second laminate was faced on the first electrode with the substrate obtained in Production Example 1 such that the electroluminescent layer was opposed to the first electrode, and then pressed and bonded thereto to produce an electroluminescent sheet.

As a result of subjecting the resulting electroluminescent sheet to luminance measurement, it was confirmed that the luminance thereof was 90 cd/m$^2$.

Example 5

Two hundred parts by mass of an electroluminescent (EL) substance composed of ZnS.Cu ("GGS42 Green" available from Osram Sylvania Corp.; average particle size: 25 μm) were added to 100 parts by mass (in terms of a solid component) of an acrylic resin (copolymer of n-butyl acrylate and acrylic acid (90/10); weight-average molecular weight: 700,000; Tg=−45° C.) and uniformly dispersed therein to prepare a luminescent composition having a pressure sensitive adhesive property.

Next, the thus prepared luminescent composition was applied onto the second electrode with the substrate obtained in Production Example 2 using a knife coater, and then dried at 110° C. for 2 min to form an electroluminescent layer having a thickness of 50 μm, thereby obtaining a second laminate. Successively, a dielectric material ("DOTITE 0.14 L-615" available from Fujikura Kasei Co., Ltd.) was applied onto the first electrode with the substrate obtained in Production Example 1 to form a dielectric layer having a thickness of 10 μm thereon. Then, the thus obtained laminate was faced on the second laminate such that the dielectric layer of the laminate was opposed to the electroluminescent layer of the second laminate, and then pressed and bonded thereto to produce an electroluminescent sheet.

As a result of subjecting the resulting electroluminescent sheet to luminance measurement, it was confirmed that the luminance thereof was 115 cd/m².

Example 6

Two hundred parts by mass of an electroluminescent (EL) substance composed of ZnS.Cu ("GGS42 Green" available from Osram Sylvania Corp.; average particle size: 25 μm) were added to 100 parts by mass (in terms of a solid component) of an acrylic resin (copolymer of n-butyl acrylate and acrylic acid (90/10); weight-average molecular weight: 700,000; Tg=−45° C.) and uniformly dispersed therein to prepare a luminescent composition having a pressure sensitive adhesive property.

Next, the thus prepared luminescent composition was applied onto a release film using a knife coater, and then dried at 110° C. for 2 min to form an electroluminescent layer having a thickness of 50 μm without a carrier. Thereafter, the resulting electroluminescent layer was laminated on the second electrode to obtain a second laminate, followed by removing the release film therefrom. Then, the thus obtained second laminate was faced on the first electrode with the substrate obtained in Production Example 1, and then pressed and bonded thereto to produce an electroluminescent sheet.

As a result of subjecting the resulting electroluminescent sheet to luminance measurement, it was confirmed that the luminance thereof was 136 cd/m².

Example 7

One hundred parts by mass of an acrylic resin (copolymer of n-butyl acrylate and acrylic acid (90/10); weight-average molecular weight: 700,000; Tg=−45° C.) were mixed and stirred with 1.5 parts by mass of a precipitation inhibitor composed of a composite material of a higher fatty acid amide and a wax ("DISPARLON 6900-20X" available from Kusumoto Chemicals Ltd.; amide wax; solid concentration: 20%). 200 parts by mass of an electroluminescent (EL) substance composed of ZnS.Cu ("GGS42 Green" available from Osram Sylvania Corp.; average particle size: 25 μm) were added into 100 parts by mass (in terms of a solid component) of the resulting mixture, and uniformly dispersed, thereby preparing a luminescent composition having a pressure sensitive adhesive property.

Next, the thus prepared luminescent composition was applied onto the second electrode with the substrate obtained in Production Example 2 using a knife coater, and then dried at 110° C. for 2 min to form an electroluminescent layer having a thickness of 50 μm, thereby obtaining a second laminate. Then, the thus obtained second laminate was faced on the first electrode with the substrate obtained in Production Example 1 such that the electroluminescent layer was opposed to the first electrode, and then pressed and bonded thereto to produce an electroluminescent sheet.

As a result of subjecting the resulting electroluminescent sheet to luminance measurement, it was confirmed that the luminance thereof was 138 cd/m².

Comparative Example 1

Two hundred parts by mass of an electroluminescent (EL) substance composed of ZnS.Cu ("GGS42 Green" available from Osram Sylvania Corp.; average particle size: 25 μm) were added to 100 parts by mass (in terms of a solid component) of an organic binder composed mainly of a polyester ("DOTITE XB-9010" available from Fujikura Kasei Co., Ltd.; Tg=54° C.) and uniformly dispersed therein to prepare a luminescent composition.

Next, the thus prepared luminescent composition was applied onto the first electrode with the substrate obtained in Production Example 1 by a screen-printing method, and then dried at 110° C. for 10 min. The procedure from the application of the composition up to the drying was repeated 5 times to form an electroluminescent layer having a thickness of 50 μm, thereby obtaining a first laminate. Then, a material for second electrode ("DOTITE FEC-198" available from Fujikura Kasei Co., Ltd.; carbon paste) was applied onto the electroluminescent layer of the first laminate by a screen-printing method, and then dried at 110° C. for 10 min to form a second electrode having a thickness of 8 μm. Successively, a dielectric material ("DOTITE KB-101G" available from Fujikura Kasei Co., Ltd.) was applied onto the second electrode by a screen-printing method, and then dried at 110° C. for 10 min to form a dielectric layer having a thickness of 8 μm, thereby producing an electroluminescent sheet.

As a result of subjecting the resulting electroluminescent sheet to luminance measurement, it was confirmed that the luminance thereof was 145 cd/m².

As a result, it was confirmed that the electroluminescent sheets using the luminescent compositions obtained in Examples 1 to 7 were able to be produced with a high productivity and had an excellent luminance On the other hand, upon production of the electroluminescent sheet using the luminescent composition obtained from the resin having a glass transition temperature of 54° C., it was required to repeat the procedure from application of the composition to drying 5 times. Therefore, the latter electroluminescent sheet was unsatisfactory in productivity as compared to the electroluminescent sheets of Examples 1 to 7 which were produced only by press-bonding.

INDUSTRIAL APPLICABILITY

The luminescent composition having a pressure sensitive adhesive property of the present invention can be used in an electroluminescent layer of an electroluminescent sheet which serves as a backlight for advertizing media and decorating media disposed on windows of commercial buildings or automobiles, or security sheets, etc., and can provide the electroluminescent sheet with a high productivity at low costs in an efficient manner.

The invention claimed is:

1. A luminescent composition having a pressure sensitive adhesive property, and comprising an electroluminescent substance uniformly dispersed in a pressure sensitive adhesive resin,
 wherein the resin has a glass transition temperature of from −55 to −25° C. and is an acrylic resin, a polyester-comprising resin or a polyurethane-comprising resin.

2. The luminescent composition according to claim 1, wherein a content of the electroluminescent substance in the luminescent composition is from 20 to 400 parts by mass based on 100 parts by mass of the resin.

3. The luminescent composition according to claim 1 further comprising a precipitation inhibitor in an amount of from 0.1 to 5 parts by mass based on 100 parts by mass of the resin.

4. An electroluminescent sheet, comprising:
   a first substrate;
   a first electrode;
   an electroluminescent layer;
   a second electrode; and
   a second substrate,
   which are successively laminated in this order,
   wherein the first substrate and the first electrode are transparent, and the electroluminescent layer is formed from the luminescent composition as defined in claim 1.

5. The electroluminescent sheet according to claim 4, further comprising a dielectric layer which is formed between the first electrode and the electroluminescent layer and/or between the electroluminescent layer and the second electrode.

6. A process for producing the electroluminescent sheet as defined in claim 4, comprising
   (1a) successively forming at least the first electrode and the electroluminescent layer on the first substrate to prepare the first laminate, and separately forming at least the second electrode on the second substrate to prepare the second laminate; or
   (1b) forming at least the first electrode on the first substrate to prepare the first laminate, and separately successively forming the second electrode and the electroluminescent layer on the second substrate to prepare the second laminate; and
   (2) directly bonding the electroluminescent layer of the first laminate to a side of the second electrode of the second laminate, or directly bonding the electroluminescent layer of the second laminate to a side of the first electrode of the first laminate.

7. A process for producing the electroluminescent sheet according to claim 5, comprising carrying out one of the following (3) through (12), followed by bonding a side of the dielectric layer, the electroluminescent layer or the first electrode of the first laminate to a side of the second electrode, the electroluminescent layer or the dielectric layer of the second laminate:
   (3) successively forming at least the first electrode, the dielectric layer, and the electroluminescent layer on the first substrate to prepare the first laminate, and separately forming at least the second electrode on the second substrate to prepare the second laminate;
   (4) successively forming at least the first electrode and the dielectric layer on the first substrate to prepare the first laminate, and separately successively forming at least the second electrode and the electroluminescent layer on the second substrate to prepare the second laminate;
   (5) forming at least the first electrode on the first substrate to prepare the first laminate, and separately successively forming at least the second electrode, the electroluminescent layer, and the dielectric layer on the second substrate to prepare the second laminate;
   (6) successively forming at least the first electrode, the electroluminescent layer, and the dielectric layer on the first substrate to prepare the first laminate, and separately forming at least the second electrode on the second substrate to prepare the second laminate;
   (7) successively forming at least the first electrode and the electroluminescent layer on the first substrate to prepare the first laminate, and separately successively forming at least the second electrode and the dielectric layer on the second substrate to prepare the second laminate;
   (8) forming at least the first electrode on the first substrate to prepare the first laminate, and separately successively forming at least the second electrode, the dielectric layer, and the electroluminescent layer on the second substrate to prepare the second laminate;
   (9) successively forming at least the first electrode, a first dielectric layer, the electroluminescent layer, and a second dielectric layer on the first substrate to prepare the first laminate, and separately forming at least the second electrode on the second substrate to prepare the second laminate, wherein the first and second dielectric layers formed on sides of the first electrode and the second electrode are the same or different from each other;
   (10) successively forming at least the first electrode, the first dielectric layer, and the electroluminescent layer on the first substrate to prepare the first laminate, and separately successively forming at least the second electrode and the second dielectric layer on the second substrate to prepare the second laminate, wherein the first and second dielectric layers formed on sides of the first electrode and the second electrode are the same or different from each other;
   (11) successively forming at least the first electrode and the first dielectric layer on the first substrate to prepare the first laminate, and separately successively forming at least the second electrode, the second dielectric layer, and the electroluminescent layer on the second substrate to prepare the second laminate, wherein the first and second dielectric layers formed on sides of the first electrode and the second electrode are the same or different from each other;
   (12) forming at least the first electrode on the first substrate to prepare the first laminate, and separately successively forming at least the second electrode, the first dielectric layer, the electroluminescent layer, and the second dielectric layer on the second substrate to prepare the second laminate, wherein the first and second dielectric layers formed on sides of the first electrode and the second electrode are the same or different from each other.

8. The process for producing the electroluminescent sheet according to claim 7, wherein the dielectric layer has an adhesion property.

9. The luminescent composition according to claim 1, wherein the glass transition temperature of the resin is from −52 to −34° C.

10. The luminescent composition according to claim 1, wherein the resin is an acrylic resin.

11. The luminescent composition according to claim 9, wherein the resin is an acrylic resin.

12. The luminescent composition according to claim 1, wherein the resin is a polyester-comprising resin.

13. The luminescent composition according to claim 1, wherein the resin is a polyurethane-comprising resin.

14. The luminescent composition according to claim 2, further comprising a precipitation inhibitor in an amount of from 0.1 to 5 parts by mass based on 100 parts by mass of the resin.

15. The luminescent composition according to claim 9, further comprising a precipitation inhibitor in an amount of from 0.1 to 5 parts by mass based on 100 parts by mass of the resin.

16. The luminescent composition according to claim 10, further comprising a precipitation inhibitor in an amount of from 0.1 to 5 parts by mass based on 100 parts by mass of the resin.

17. The luminescent composition of claim 1, which is produced by kneading and dispersing the electroluminescent substance in the resin.

18. The luminescent composition of claim 1, wherein the electroluminescent substance is inorganic.

19. The luminescent composition according to claim 1, wherein a content of the electroluminescent substance in the luminescent composition is from 100 to 300 parts by mass based on 100 parts by mass of the resin.

20. The luminescent composition according to claim 1, wherein a content of the electroluminescent substance in the luminescent composition is from 200 to 300 parts by mass based on 100 parts by mass of the resin.

21. The luminescent composition according to claim 1, wherein the electroluminescent substance is in a form of particles, and the particles have an average particle size of from 1 to 100 μm.

22. The electro luminescent sheet according to claim 4, wherein a thickness of the electroluminescent layer is from 0.1 to 100 μm.

23. The luminescent composition according to claim 1, wherein the electroluminescent substance is an inorganic electroluminescent material, and which is selected from a material comprising a base material of zinc sulfide (ZnS) and a luminescent center material selected from copper, manganese, terbium fluoride, samarium fluoride and thulium fluoride; a material comprising a base material of calcium sulfide (CaS) and a luminescent center material of europium; a material comprising a base material of strontium sulfide (SrS) and a luminescent center material of cerium; a material comprising a base material selected from an alkali earth element calcium sulfide and a luminescent center material selected from manganese, europium, cerium and terbium; and an oxide luminescent material comprising $Sc_2O_3$ that is doped with a rare earth element other than Sc.

24. The luminescent composition according to claim 1, wherein the electroluminescent substance is an organic electroluminescent material, and which is selected from benzoxazole derivatives, benzimidazole derivatives, benzothiazole derivatives, styryl benzene derivatives, polyphenyl derivatives, diphenyl butadiene derivatives, tetraphenyl butadiene derivatives, naphthalimide derivatives, coumarin derivatives, perylene derivatives, perinone derivatives, oxadiazole derivatives, aldazine derivatives, pyralidine derivatives, cyclopentadiene derivatives, bis(styryl)anthracene derivatives, quinacridone derivatives, pyrrolopyridine derivatives, thiadiazolopyridine derivatives, styryl amine derivatives, aromatic dimethylidene compounds, metal complexes or rare earth complexes of 8-quinolinol derivatives, orthometallized metal complexes, porphyrin metal complexes, polythiophene derivatives, polyphenylene derivatives, polyphenylene vinylene derivatives and polyfluorene derivatives.

\* \* \* \* \*